US009837533B2

(12) United States Patent
Kuang et al.

(10) Patent No.: US 9,837,533 B2
(45) Date of Patent: Dec. 5, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shin-Jiun Kuang, Hsinchu (TW); Tsung-Hsing Yu, Taipei (TW); Yi-Ming Sheu, Hsinchu (TW); Chun-Yi Lee, Hsinchu County (TW); Chia-Wen Liu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 404 days.

(21) Appl. No.: 14/320,728

(22) Filed: Jul. 1, 2014

(65) Prior Publication Data
US 2016/0005863 A1   Jan. 7, 2016

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/30604* (2013.01); *H01L 21/30608* (2013.01);
(Continued)

(58) Field of Classification Search
None
See application file for complete search history.

(56) References Cited

U.S. PATENT DOCUMENTS 8,679,910 B2\* 3/2014 Ming ............. H01L 21/823807
438/224
8,835,995 B2   9/2014 Kang et al.
(Continued)

FOREIGN PATENT DOCUMENTS

CN   102376766   3/2012
CN   103383962   11/2013
(Continued)

OTHER PUBLICATIONS

Office Action issued by Korean Patent Office dated Sep. 10, 2015.
(Continued)

*Primary Examiner* — Jack Chen
(74) *Attorney, Agent, or Firm* — WPAT, P.C., Intellectual Property Attorneys; Anthony King

(57) ABSTRACT

Some embodiments of the present disclosure provide a semiconductor structure, including a substrate and a regrowth region. The substrate is made of a first material with a first lattice constant, and the regrowth region is made of the first material and a second material, having a lattice constant different from the first lattice constant. The regrowth region is partially positioned in the substrate. The regrowth region has a "tip depth" measured vertically from a surface of the substrate to a widest vertex of the regrowth region, and the tip depth being less than 10 nm. The regrowth region further includes a top layer substantially made of the first material, and the top layer has substantially the first lattice constant.

20 Claims, 17 Drawing Sheets

(51) Int. Cl.
*H01L 21/306* (2006.01)
*H01L 29/08* (2006.01)
*H01L 29/165* (2006.01)

(52) U.S. Cl.
CPC ........ *H01L 29/0847* (2013.01); *H01L 29/165* (2013.01); *H01L 29/66636* (2013.01); *H01L 29/7834* (2013.01)

(56) References Cited

U.S. PATENT DOCUMENTS

| | | |
|---|---|---|
| 2008/0217686 A1 | 9/2008 | Majumdar et al. |
| 2012/0032240 A1 | 2/2012 | Mayuzumi |
| 2014/0110793 A1 | 4/2014 | Hong |
| 2014/0231923 A1 | 8/2014 | Yin et al. |

FOREIGN PATENT DOCUMENTS

| | | |
|---|---|---|
| KR | 10-2012-0025314 B2 | 3/2012 |
| KR | 10-2012-0035699 B2 | 4/2012 |
| KR | 20120073727 A | 7/2012 |
| KR | 20130079010 A | 7/2013 |

OTHER PUBLICATIONS

US 20140231923 is the US counterpart publication of CN 103383962.
US 20120032240 is the US counterpart publication of CN 102376766.
English abstract translation of the Chinese Office Action dated Sep. 19, 2017 for counterpart application 201510288803.6.

* cited by examiner

SEMICONDUCTOR STRUCTURE AND MANUFACTURING METHOD THEREOF

BACKGROUND

Semiconductor processing is typically used in the fabrication of integrated circuits, which entails particularly stringent quality demands. A variety of methods are used in the semiconductor manufacturing industry to deposit material onto surfaces. One of the most widely used methods is chemical vapor deposition ("CVD"), in which atoms or molecules contained in a vapor deposit on a surface to form a film. CVD allows for the growth of films on device surface areas, including "epitaxial" films comprised of a crystalline silicon-containing material It is often desirable to have epitaxial material that is strained. "Strain" may influence the electrical properties of semiconductors materials, such as silicon, carbon-doped silicon, germanium and silicon germanium alloys. Tensile strain helps to enhance electron mobility, which is particularly desirable for nMOS devices, while compressive strain helps to enhance hole mobility, which is particularly desirable for pMOS devices. Methods of providing strained material are thus of considerable interest and have potential applications in a variety of semiconductor processing applications.

Currently, the PMOS strain is realized by undercutting the source/drain area and epitaxially growing SiGe film in the undercut region. The larger lattice constant of the SiGe film provides the uniaxial strain to the Si channel. The higher the Ge concentration, the larger the strain and thus better performance. However, the Ge incorporation into the SiGe film is limited by the epitaxial process. Very high Ge concentration SiGe film is difficult to realize using the conventional epitaxial method, which is extremely sensitive to surface preparation, pre-cursors used and growth conditions. It is challenging to meet the ever-increasing Ge concentration requirement and maintain proper control of the SiGe profile for the SiGe source/drain (S/D) in PMOS with epitaxial growth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
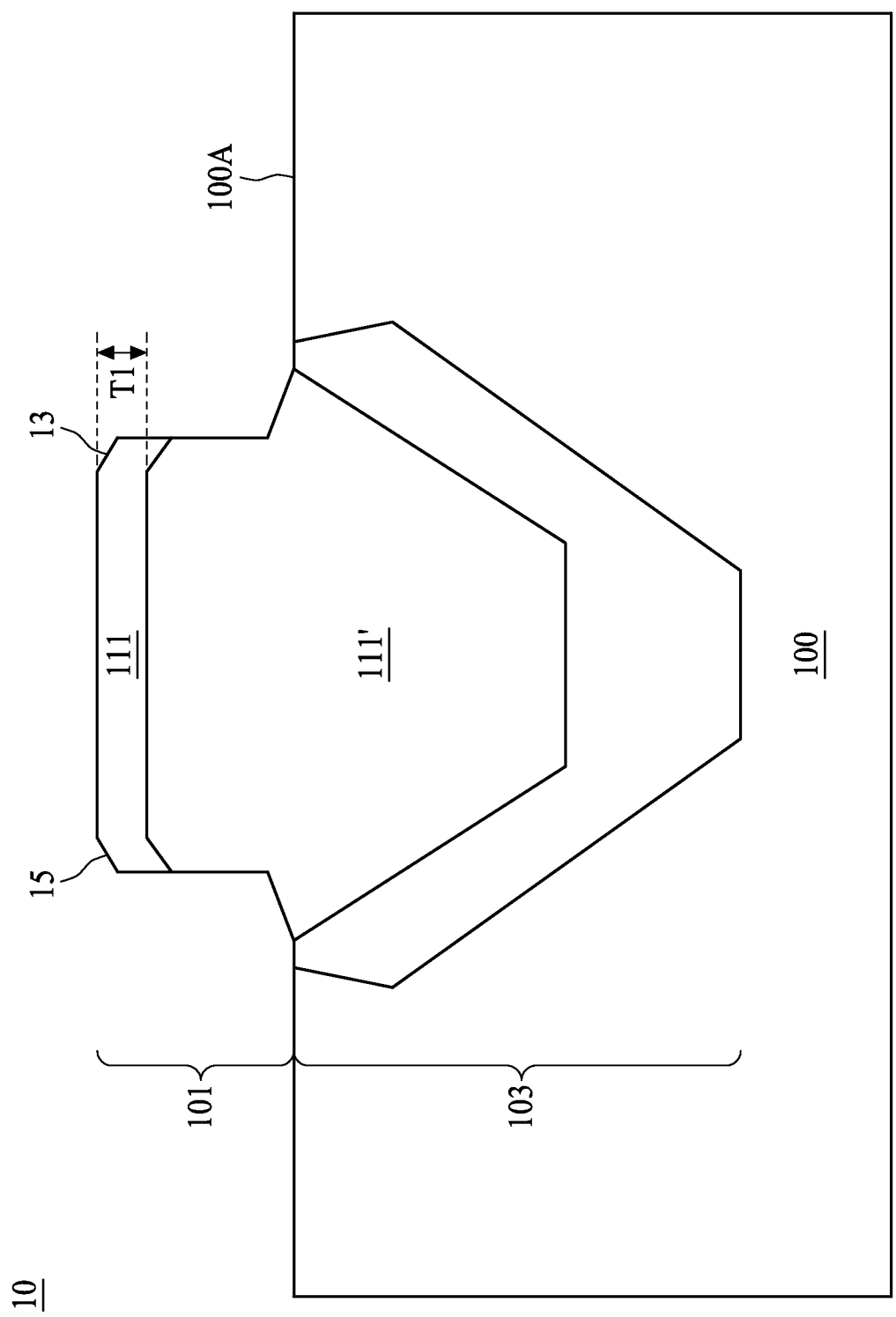
FIG. 1 is a cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The drive currents of MOS transistors may benefit from the stresses in the channel regions of the MOS transistors. Therefore, the source and drain regions of the MOS transistors may be formed by removing portions of the substrate not covered by the gate electrode, and re-growing SiGe or SiC in the spaces left by the removed portions. The re-grown SiGe or SiC are used to form source and drain regions. The regrown source and drain regions may also have the benefit of reducing the source/drain resistance if the regrown source/drain regions are in-situ doped with impurities in the re-growth process.

To reduce contact resistivity of the regrown source/drain regions, a top layer thereof can be formed of materials different from the regrown body. For example, in a PMOS structure, a silicon cap layer can be formed over a SiGe regrown body and interfaced with a contact plug subsequently formed thereon. However, the thickness of the cap layer reduces the effect of heteroepitaxial structure, that is, the strain (tensile or compressive) exerted on the channel region can be reduced, and so does the carrier mobility.

To obtain a more uniform threshold voltage and drive current among CMOS transistors that are simultaneously manufactured with regrown regions, a shape of the regrown region shall be optimized and controlled. Due to anisotropic nature of the etching operations in forming a recess of regrown region, different geometric shapes of the recess are formed depending on the etching operations. Not only the particular shape of the recess but also the uniformity of each recess affect the threshold voltage and drive current of the transistors. An optimal shape of the regrown region that can be manufactured through a controllable manner in order to produce uniform properties among transistors are hence needed.

The present disclosure provides a semiconductor structure with regrown source/drain regions having predetermined dimensions that allow transistors made of such regrown source/drain regions to achieve higher carrier mobility, higher drive current, and to reduce threshold current and drive current variation among different transistors.

Referring to FIG. 1, a cross sectional view of a semiconductor structure 10 in accordance with some embodiments of the present disclosure is shown. A regrowth region is partially positioned in a substrate 100 and is partially exposed from a surface 100A of the substrate 100. In some embodiments, the substrate 100 possesses a lattice constant different from that of the regrowth region. The lattice constant of the regrowth region may or may not be uniform. However, the lattice constant herein referred to the lattice constant of an arbitrary region in the regrowth region. In some embodiments, the substrate 100 is made of a first material and thus having a first lattice constant. The first material may be a single element, a compound, or a mixture. The regrowth region can be made of a second material or a mix of the first material and the second material. The regrowth region thereby having a second lattice constant that is different from the first lattice constant.

In some embodiments, the substrate 100 includes silicon or other elementary group IV semiconductor. The substrate 100 may also include a compound semiconductor such as silicon carbide, gallium arsenic, indium arsenide, and indium phosphide. The substrate 100 may include an alloy semiconductor such as silicon germanium, silicon germanium carbide, gallium arsenic phosphide, and gallium indium phosphide. In one embodiment, the substrate 100 includes an epitaxial layer. For example, the substrate may have an epitaxial layer overlying a bulk semiconductor. Furthermore, the substrate 100 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 100 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 100 may further include other functional features such as a resistor or a capacitor formed in and on the substrate. The substrate 100 further includes lateral isolation features provided to separate various devices formed in the substrate 100. In one embodiment, shallow trench isolation (STI) features are used for lateral isolation. The various devices further include silicide disposed on S/D, gate and other device features for reduced contact resistance when coupled to the output and input signals.

As shown in FIG. 1, the regrowth region includes a first portion 101 protruding from the surface 100A of the substrate 100 and a second portion 103 under the surface 100A of the substrate 100. A first layer 111 is formed as a top layer of the first portion 101. In some embodiments, the first layer 111 possesses a lattice constant different from that in the rest of the regrowth region 111'. For example, the lattice constant of the first layer 111 is substantially the same as that of the substrate 100. In some embodiments, the regrowth region is positioned in a PMOS structure, and the first layer 111 includes boron-doped silicon. The boron concentration in the first layer 111 is within a range of from about $7E20/cm^3$ to about $3E21/cm^3$. However, a regrowth region in an NMOS structure may have a first layer 111 made of phosphorous-doped silicon. In FIG. 1, the first layer 111 is within the first portion 101 of the regrowth region, and hence a bottom of the first layer 111 is above the surface 100A of the substrate 100.

Referring to FIG. 1, a thickness T1 of the first layer 111 can be determined by maximizing the stress that the rest of the regrowth region 111' may exert to the substrate 100 and retain a low contact resistance at the top of the regrowth region. In some embodiments, the thickness T1 is about 50% of the total thickness of the first portion 101. In other embodiments, the thickness T1 is about 30% of the total thickness of the first portion 101. In some embodiments, the first layer 111 possesses a thickness of from about 3 nm to about 15 nm. It is observed that due to different growth rates on different surface planes, facets may be formed in the rest of the regrowth region 111' or the regrowth region with the first material and the second material. In some embodiments, for a PMOS transistor, the SiGe regrowth region demonstrates faceted surface. For example, the growth rate on surfaces having {111} surface orientations is lower than that of other planes such as {110} and {100} planes. Accordingly, facets 13 and 15, which have the {111} surface orientations (in other word, on {111} planes), have the lowest growth rate, while other planes have higher growth rates. In the beginning of the epitaxial growth of the rest of the regrowth region 111', facets 13 and 15 may not be formed. Depending on various epitaxial growth conditions (for example, ratio of the first material and second material, growth rate, growth temperature, etc.), the degree of faceting may be different. However, with the proceeding of the epitaxial growth, due to the difference in growth rates, facets 13 and 15 are gradually formed. In some embodiments, the first layer 111 does not show a faceted surface. However, because the underlying surface which the first layer grown upon possesses a faceted morphology, a conformal first layer 111 is formed, and hence the top surface of the first layer 111 may not be flat.

Figure 2:
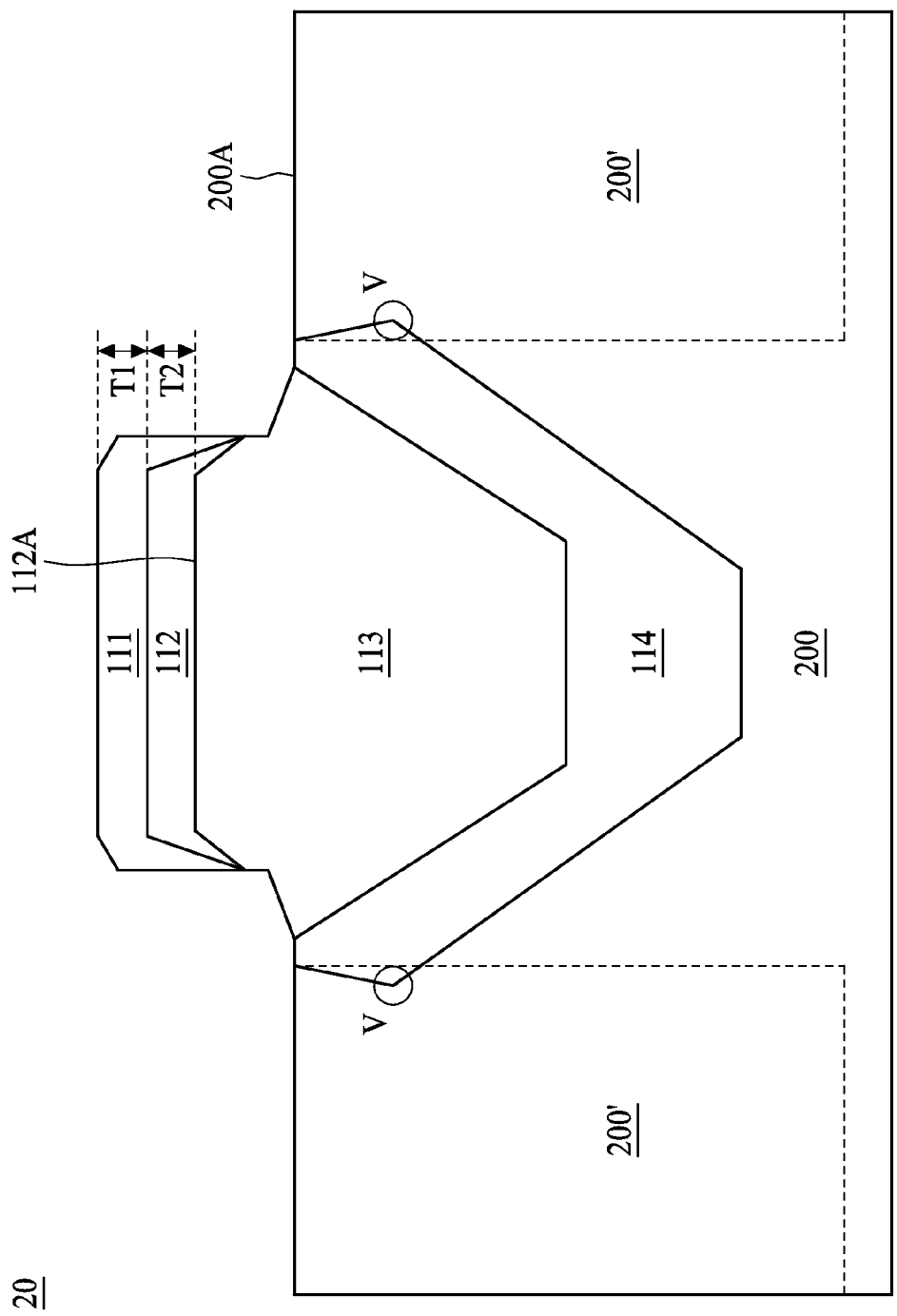
FIG. 2 is a cross sectional view of a semiconductor structure in accordance with some embodiments of the present disclosure.

Referring to FIG. 2, a cross sectional view of a semiconductor structure 20 in accordance with some embodiments of the present disclosure is shown. The semiconductor structure 20 can be a source or a drain region in a FinFET. In FIG. 2, two isolation regions 200' are positioned adjacent to a fin 200 of the FinFET. Note the widest vertex V of the regrowth region may protrude into the isolation regions 200'. In addition to the first layer 111 as previously described in FIG. 1, a second layer 112, a third layer 113, and a fourth layer 114 can be differentiated based on different concentration or concentration profiles of the second materials in the regrowth region. In FIG. 2, the second layer 112 possesses a second lattice constant that is different from the first lattice constant in the fin 200 or in the first layer 111. In some embodiments, the lattice constant in the first layer 111 and in the fin 200 can be substantially identical or different. However, the second lattice constant of the second layer 112 is different from either that of the first layer 111 or that of the fin 200. For example, in a PMOS FinFET, second layer 112 can be made of SiGe with Ge concentration of from about 20% to about 60%, and the first layer 111 can be Si. Both the first layer 111 and the second layer 112 are intrinsic doped by boron (B) with a suitable doping range from about $7E20/cm^3$ to about $3E21/cm^3$. The boron doping concentration ([B]) can be different in the first layer 111 and the second layer 112. For example, the [B] can be of $3E21/cm^3$ in the first layer 111 and $1E21/cm^3$ in the second layer 112.

Still referring to FIG. 2, the third layer 113 possesses a lattice constant different from that of the second layer 112. For example, in a PMOS FinFET, third layer 113 can be made of SiGe with Ge concentration of from about 20% to about 60%, but however the average concentration of the Ge in the third layer 113 is lower than the average Ge concentration in the second layer 112. "Average concentration" stated herein refers to the sum of the Ge concentration in proximity to the bottom of a certain layer and the Ge concentration in proximity to the top of the same layer divided by 2. In some embodiments, the Ge concentration in the second layer 112 and the third layer 113 can demonstrate uniform concentration profiles with one homogeneous concentration throughout one of the two layers. In other embodiments, the Ge concentration shows a grading profile within one of the second layer 112 and the third layer 113. No matter a uniform or a grading Ge concentration profile, the average concentration of the Ge in the third layer 113, that is, the layer closer to the fin 200, is less than the average concentration of the Ge in the second layer 112, that is, the layer further from the fin 200. In FIG. 2, a bottom 112A of the second layer 112 is above the surface 200A of the fin 200. In some embodiments, the thickness T2 of the second layer 112 is comparable to the thickness T1 of the first layer 111. In addition, thicknesses T1 and T2 can both be in a range of from about 3 nm to about 15 nm.

Figure 3:
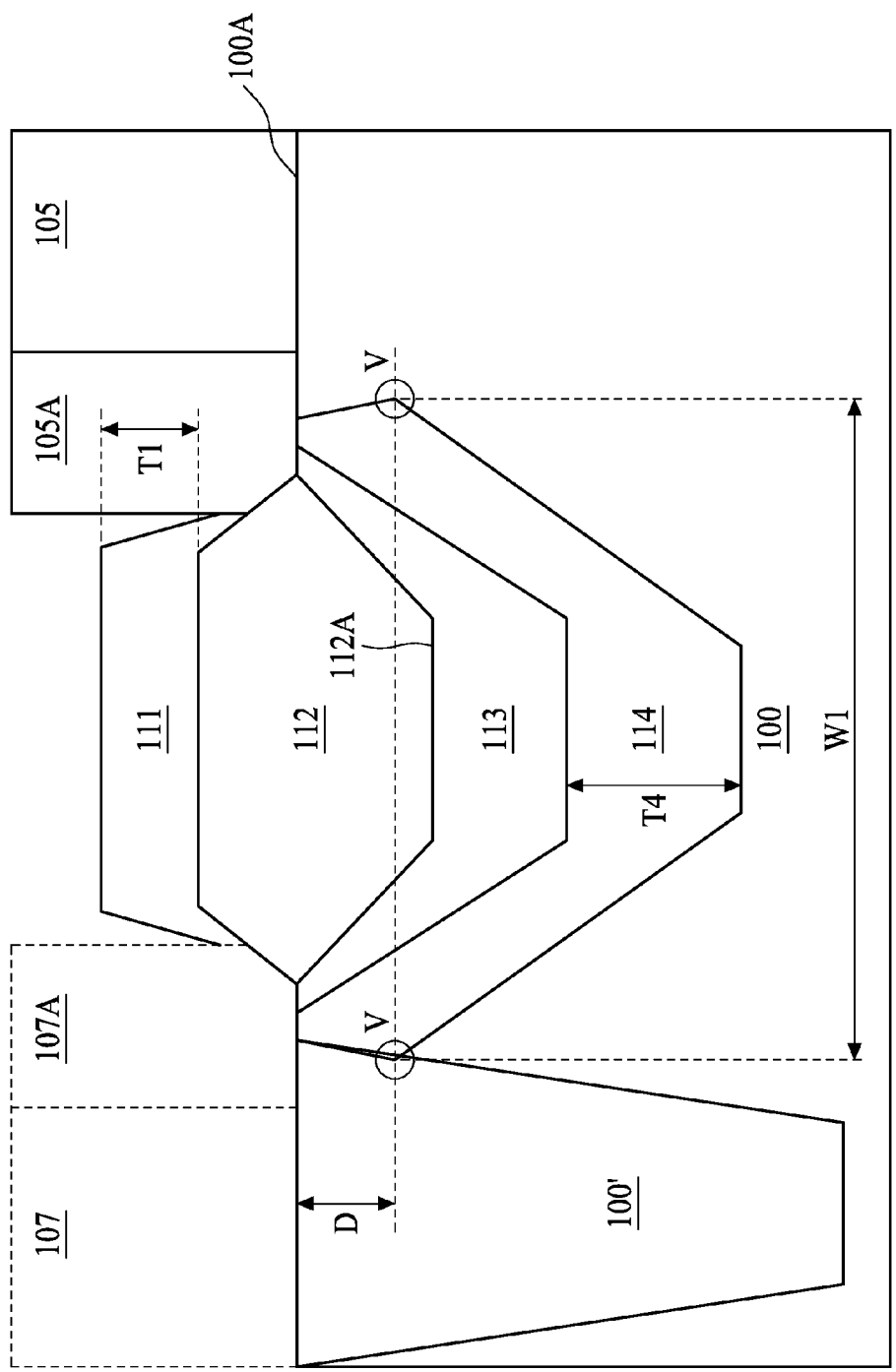
FIG. 3 is a cross sectional view of a semiconductor structure in accordance with some embodiments of the present disclosure.

Referring to FIG. 3, FIG. 3 is a cross sectional view of a planar semiconductor structure 30, in accordance with some embodiments of the present disclosure. In FIG. 3, a raised portion of the regrowth region is sandwiched between two gate structures. The raised portion of the regrowth region refers to the portion of the regrowth region extruding from the surface 100A of the substrate 100. Note the dummy gate 107 and the sidewall spacer 107A thereof are illustrated in dotted lines, indicating that the dummy gate structure (107, 107A) is to be removed after the epitaxial growth and would not be present in a final product. An isolation structure 100' such as an STI, BPSG, or the like electrically separate different transistors. Note a depth of the isolation structure 100' and a depth of the regrowth region are not drawn to scale herein. In some embodiments, the depth of the isolation structure 100' is 2 to 3 times greater than the depth of the regrowth region. Gate 105 and the sidewall spacer 105A thereof are positioned next to the raised portion of the regrowth region, defining a channel region between the regrowth region and an adjacent regrowth region (not shown).

In FIG. 3, a tip depth D is defined to characterize the geometric shape of the regrowth region. Tip depth D is a length measured vertically from the surface 100A of the substrate 100 to a widest vertex V of the regrowth region. The widest vertex V is positioned on a horizontal line passing through the widest portion of the regrowth region. For example, the widest portion shown in FIG. 3 possesses a width W1. In some embodiments, the widest vertex V is a corner defined by two faceted surfaces formed as a result of a recess formation. In some embodiments, the tip depth D is less than 10 nm. As shown in FIG. 3, instead of positioning under the gate 105, the widest vertex V of the regrowth region is situated under the sidewall spacer 105A of the gate 105. Of course, in other embodiments, the regrowth region can be situated under the gate 105. The numeral labels in FIG. 3 with identical notations as those in FIG. 1 and FIG. 2 refer to the same or equivalent structures thereof and is not described here for simplicity. The regrowth region in FIG. 3 has a first layer 111, a second layer 112, a third layer 113, and a fourth layer 114. Note a bottom surface 112A of the second layer 112 in FIG. 3 is below the substrate surface 100A, and the thickness T1 of the first layer 111 can be twice as thick as the thickness T1 shown in FIG. 2 where the second layer 112 has a bottom surface 112A above the surface 200A of the fin 200. The fourth layer 114 of the regrowth region is an epitaxial layer interfaced with the substrate 100. In some embodiments, for example in a PMOS FinFET, the fourth layer 114 can be SiGe with Ge concentration of from about 10% to about 40% and having a bottom thickness T4 of from about 5 nm to about 25 nm. In some embodiments, the [B] in the fourth layer 114 can be in a range of from about 0 to about $1E19/cm^3$.

Figure 5:
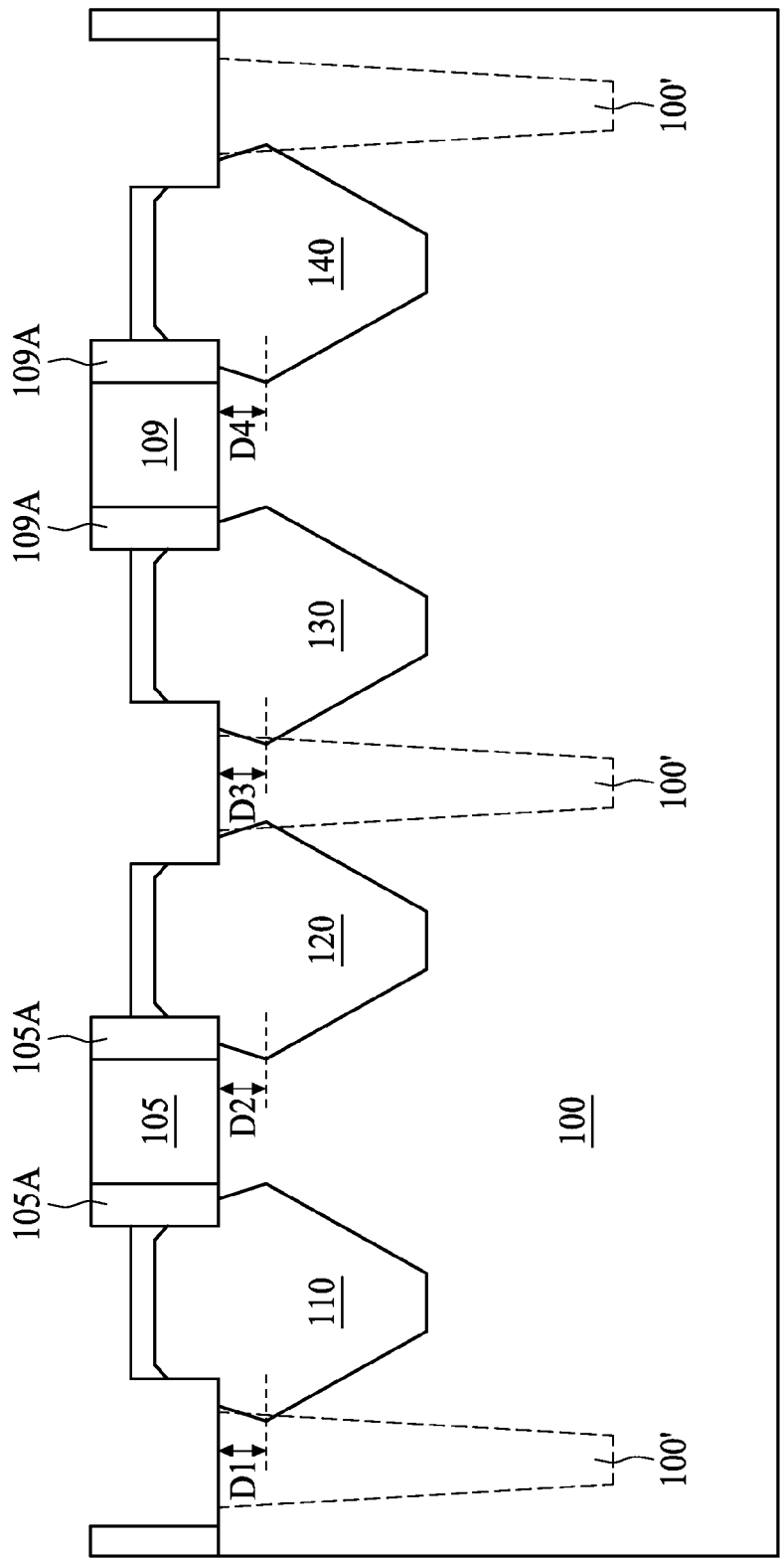
FIG. 5 is a cross sectional view of a semiconductor structure in accordance with some embodiments of the present disclosure.

Referring now to FIG. 5, the cross section of some regrowth regions in accordance with some embodiments of the present disclosure are shown. Two transistor structures can be identified by the two gate structures (105, 105A, 109, 109A) and the regrowth regions 110, 120, 130, 140 (source and drain) corresponding to each of the two gate structures. The two adjacent transistors are isolated by isolation structures 100' embedded in the substrate 100. Each of the regrowth regions 110, 120, 130, or 140 possesses a tip depth D1, D2, D3, and D4, respectively. The definition of tip depth is previously described in FIG. 3 and is not repeated here. In some embodiments, the tip depth among the regrowth regions 110, 120, 130, or 140 are within a quantity variation of about 2 nm. That is, a difference between any two of the tip depths selected from D1, D2, D3, and D4 shall be lower than the amount of 2 nm.

Figure 4:
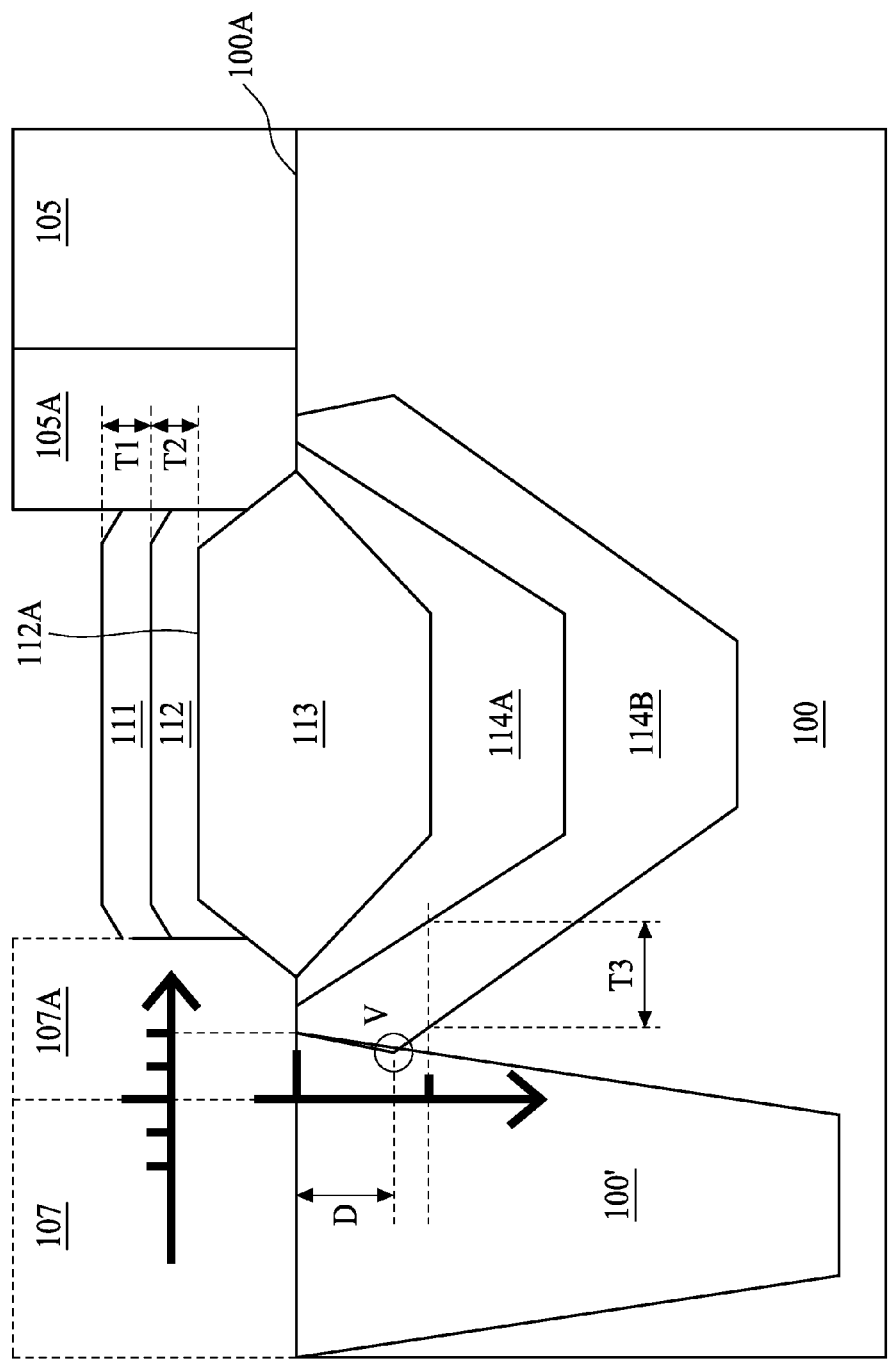
FIG. 4 is a cross sectional view of a semiconductor structure in accordance with some embodiments of the present disclosure.

Referring back to FIG. 4, FIG. 4 is a cross sectional view of a semiconductor structure 40, in accordance with some embodiments of the present disclosure. In addition to the bottom thickness T4 as shown in the semiconductor structure 30 in FIG. 3, a lower portion 114B of the fourth layer further includes a sidewall thickness T3 ranging from about 5 nm to about 15 nm. Compared to FIG. 3, the fourth layer shown in FIG. 4 includes an upper portion 114A and a lower portion 114B. In some embodiments, the upper portion 114A and the lower portion 114B can have different concentration profile such as different grading speed. As shown in FIG. 4, sidewall thickness T3 is measured in a transverse direction a predetermined value below the surface 100A, from an interface between the substrate 100 and the lower portion 114B of the fourth layer to a layer further from the substrate, that is, the upper portion 114A of the fourth layer. In some embodiments, the predetermined value can be 0.01 μm. In other embodiments, the predetermined value below the surface 100A can be more than 0.01 μm. In other embodiments where the fourth layer is composed of a single layer, the sidewall thickness T3 can be measured in a transverse direction 0.01 μm below the surface 100A, from an interface between the substrate 100 and the fourth layer (not shown in FIG. 4) to the third layer 113. In some embodiments, the regrowth region in FIG. 4 further includes a first layer 111 made of a material substantially identical to the substrate 100, having a lattice constant different from those of the other layers (112, 113, 114A, 114B) of the regrowth region. For example in a PMOS transistor, the first layer 111 includes boron-doped silicon, and the other layers (112, 113, 114A, 114B) of the regrowth region includes SiGe with various Ge concentration profiles.

Figure 6:
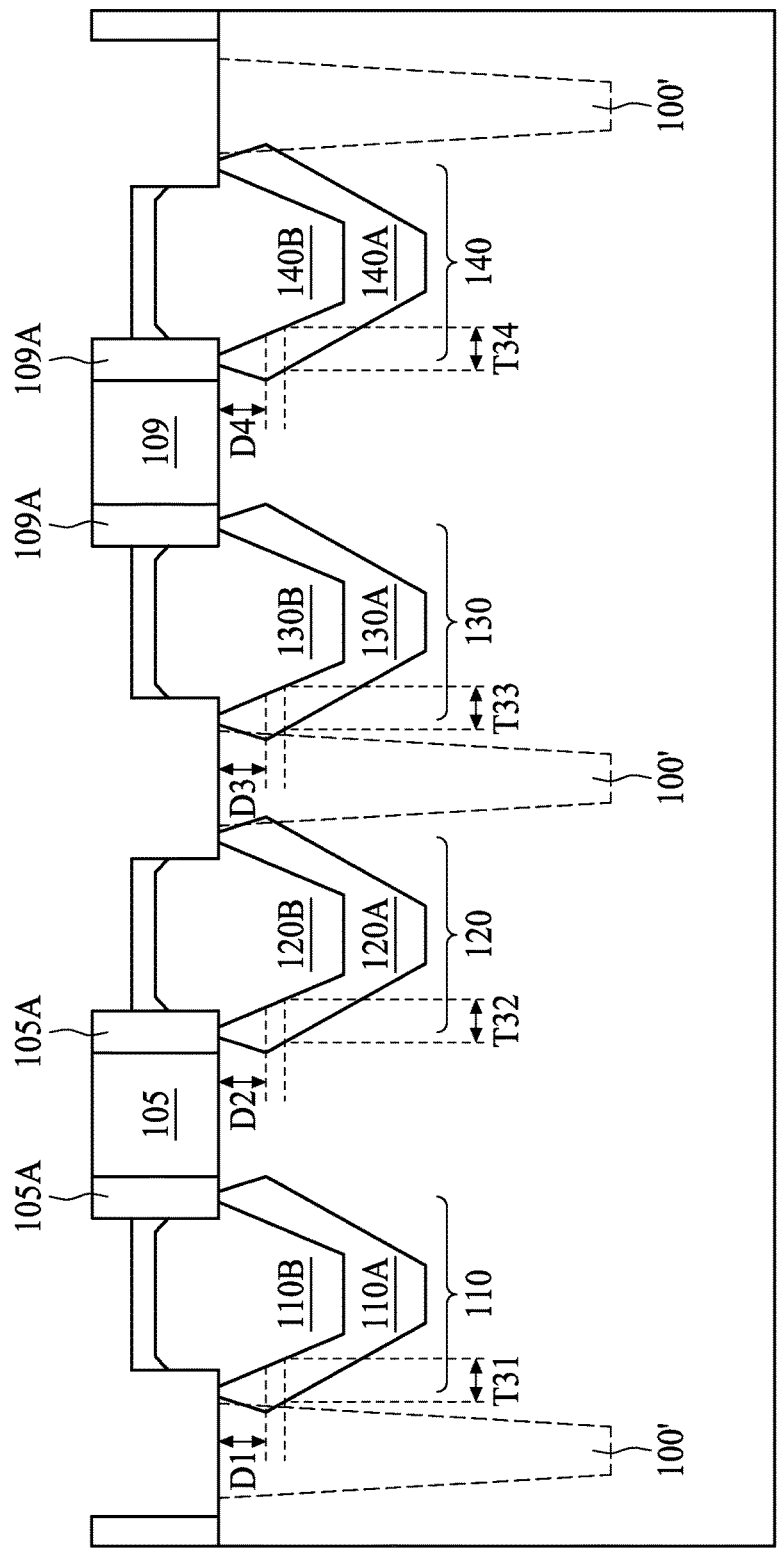
FIG. 6 is a cross sectional view of a semiconductor structure in accordance with some embodiments of the present disclosure.

Referring now to FIG. 6, the cross section of some regrowth regions in accordance with some embodiments of the present disclosure are shown. Two transistor structures can be identified by the two gate structures (105, 105A, 109, 109A) and the regrowth regions 110, 120, 130, 140 (source and drain) corresponding to each of the two gate structures. The two adjacent transistors are isolated by isolation structures 100' embedded in the substrate 100. Each of the regrowth regions 110, 120, 130, or 140 possesses a tip depth D1, D2, D3, and D4, respectively; and each of the regrowth regions 110, 120, 130, or 140 possesses a sidewall thickness T31, T32, T33, and T34, respectively. Definition of the sidewall thickens is previously described in FIG. 4 and is not repeated here. As shown in FIG. 6, each of the regrowth regions, for example, the regrowth region 110, further includes a first grading region 110A and a second grading region 110B. The first grading region 110A is a layer in the regrowth region interfacing with the substrate 100 and possesses a sidewall thickness T31. Still referring to the regrowth region 110, sidewall thickness T31 has a linear relation with the tip depth D1, following a regression curve below:

$$\text{Sidewall Thickness} = \text{Tip Depth} * 0.06743 + 4.2556 \quad \text{(Eq. 1)}$$

In some embodiments, the sidewall thickness and the tip depth of each of the regrowth regions 110, 120, 130, 140 closely follow the above regression curve. In other embodiments, the quantity variation among different tip depth is below a predetermined value as previously described in FIG. 5, hence the dimensions of the regrowth regions 110, 120, 130, 140 are uniform, rendering better device performance.

Figure 7:
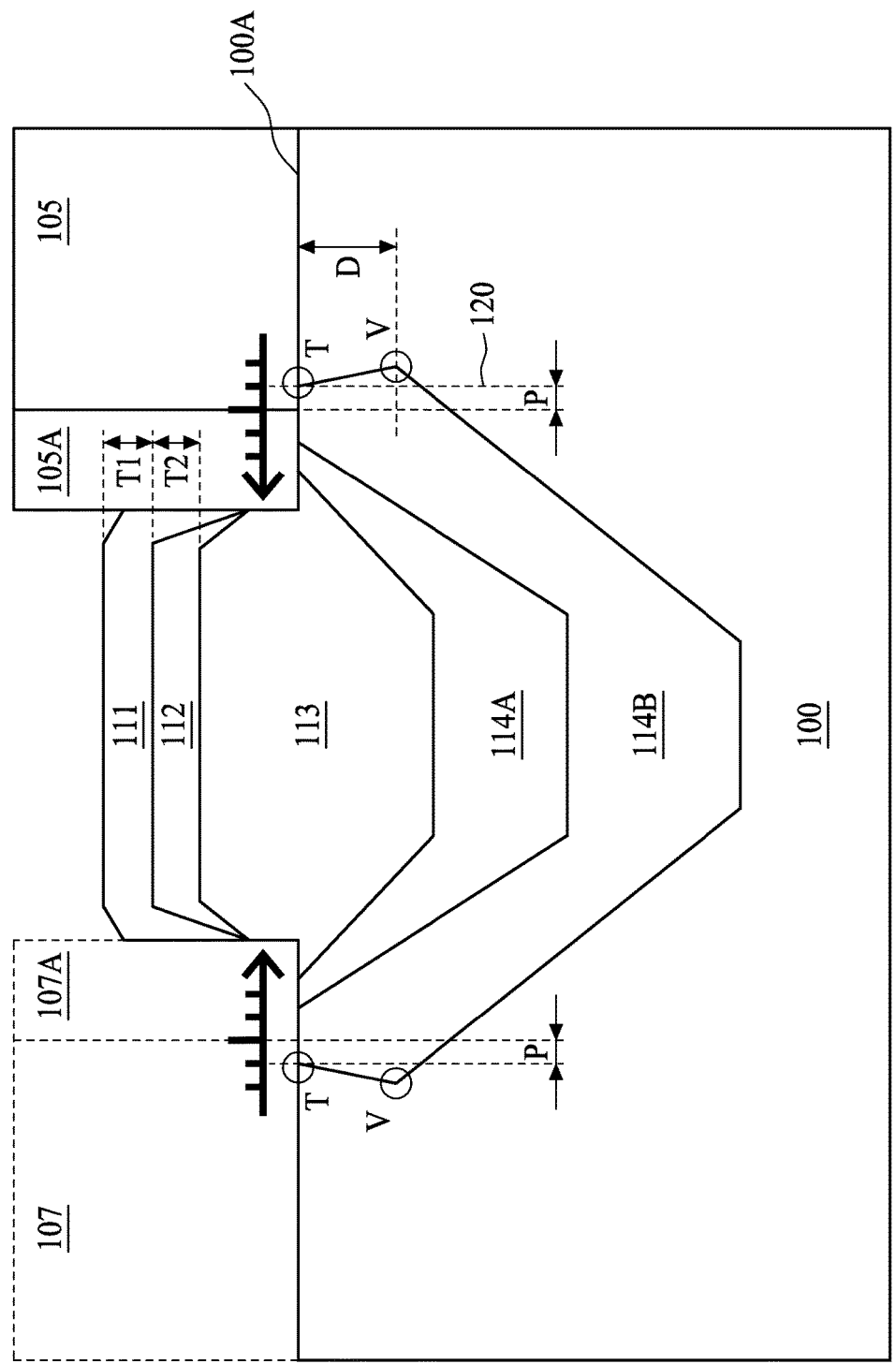
FIG. 7 is a cross sectional view of a semiconductor structure in accordance with some embodiments of the present disclosure.

Referring to FIG. 7, FIG. 7 is a cross sectional view of a semiconductor structure 50, in accordance with some embodiments of the present disclosure. In FIG. 7, the regrowth region further includes a proximity P less than about 1 nm. The proximity P referred herein is measured in a transverse direction along the surface 100A of the substrate, from an interface between a gate 105 and a sidewall spacer 105A thereof to a point where the fourth layer (114 shown in FIG. 2 and FIG. 3) or a layer at the bottom of the regrowth region (114B shown in FIG. 4 and FIG. 7) intercepting with the surface 100A. In other words, the point defining one end of the proximity P is a triple point T where a portion of the gate structure (105, 105A), the substrate 100, and the bottom layer of the epitaxy region meet. As shown in FIG. 7, the triple point T is under the gate 105 instead of under the sidewall spacer 105A thereof, the proximity P of regrowth region is measured to be 1 nm. As shown in FIG. 7, a ruler illustrated shows calibrations in a unit of 1 nm. The origin is positioned at the interface between the gate 105 and the sidewall spacer 105A thereof. In some embodiments, positions closer to the raised portion of the regrowth region is positive, and positions further from the raised portion of the regrowth region is negative. Therefore, the proximity P of the regrowth region in FIG. 7 is negative 1 nm. However, other embodiments of the present disclosure provide a negative proximity with an absolute value less than 1 nm. Similarly, referring back to FIG. 4, the proximity of the regrowth structure is positive 2 nm. However, other embodiments of the present disclosure provide a positive proximity with an absolute value less than 2 nm.

Figure 11A:
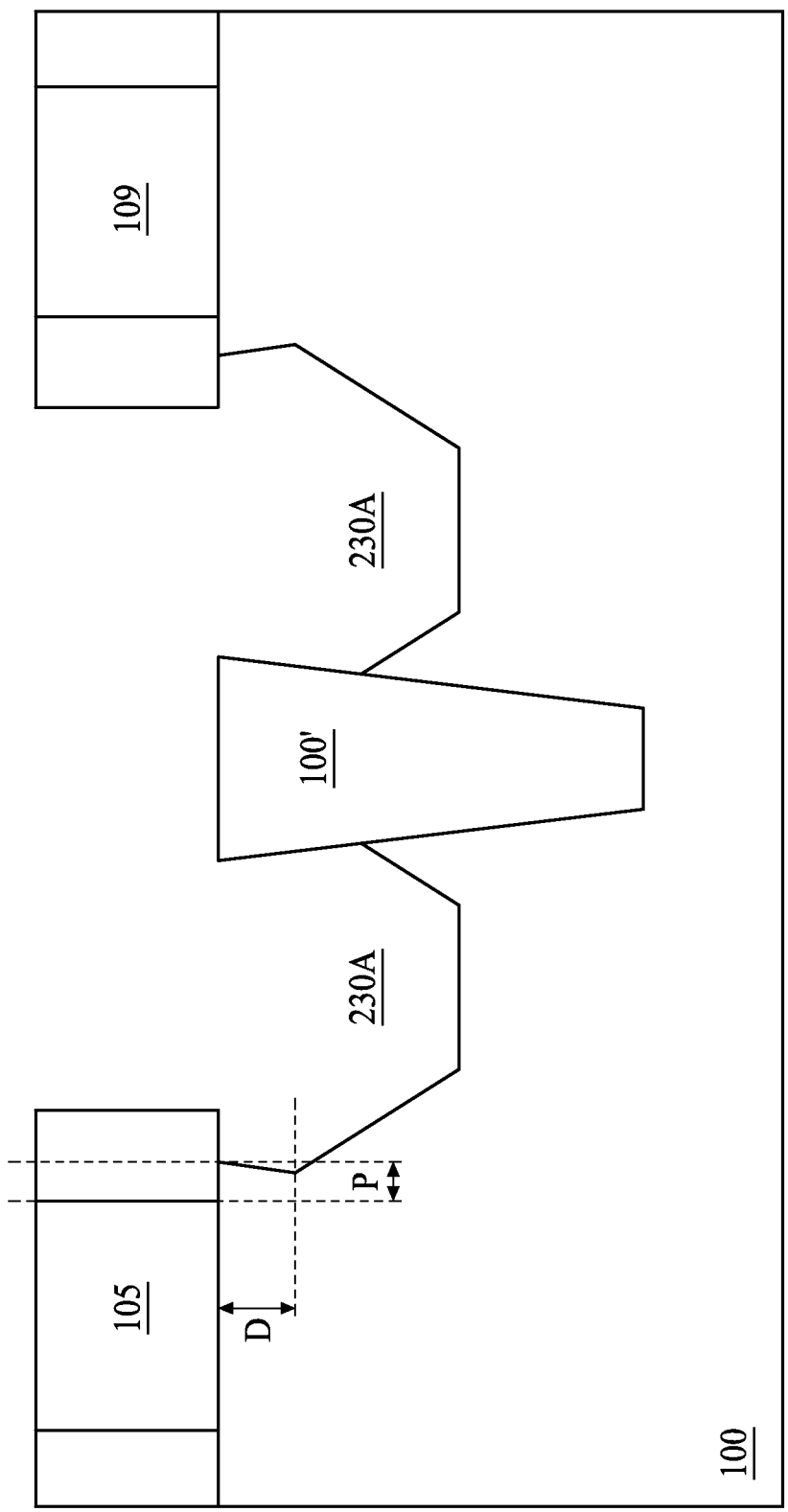
Figure 11B:
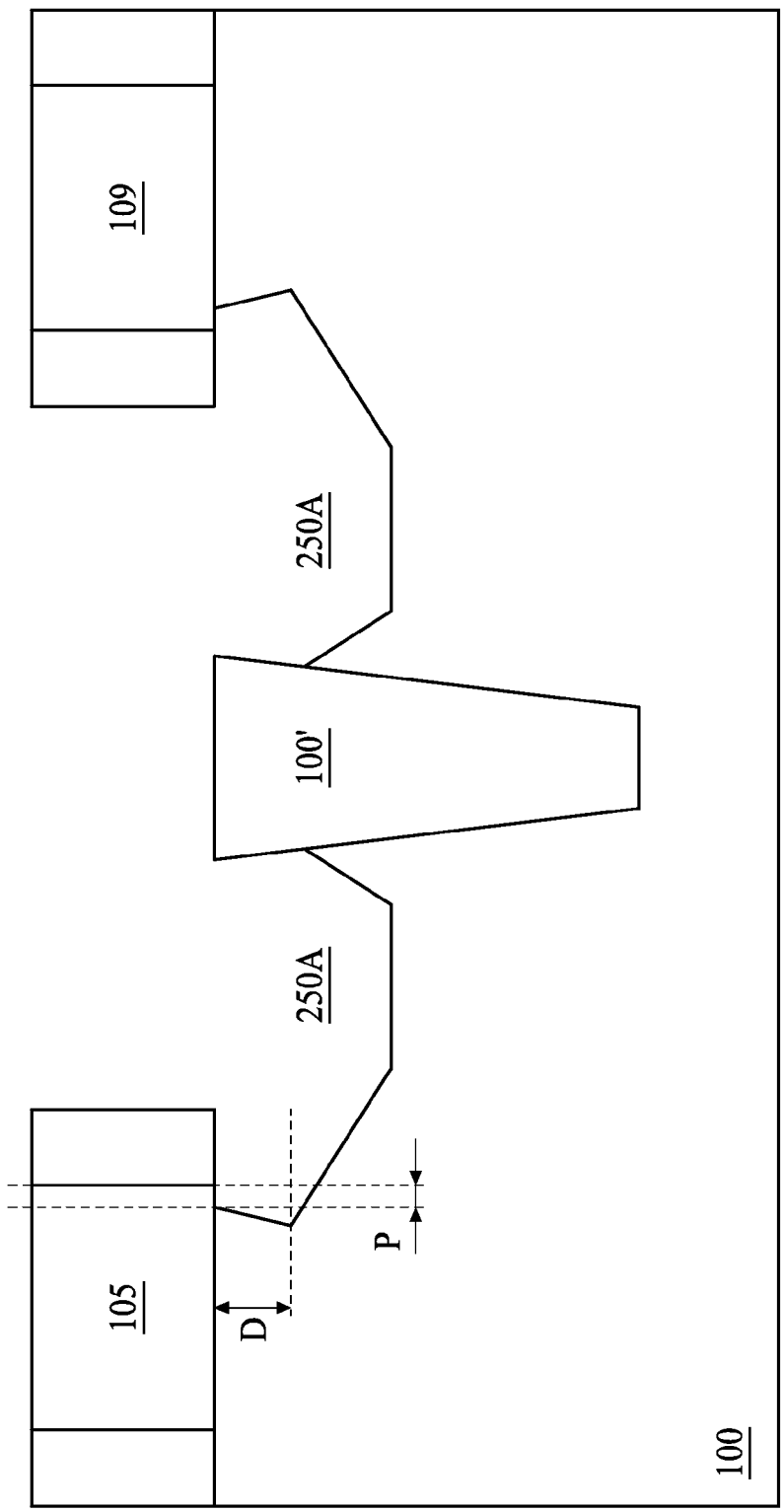
Figure 12A:
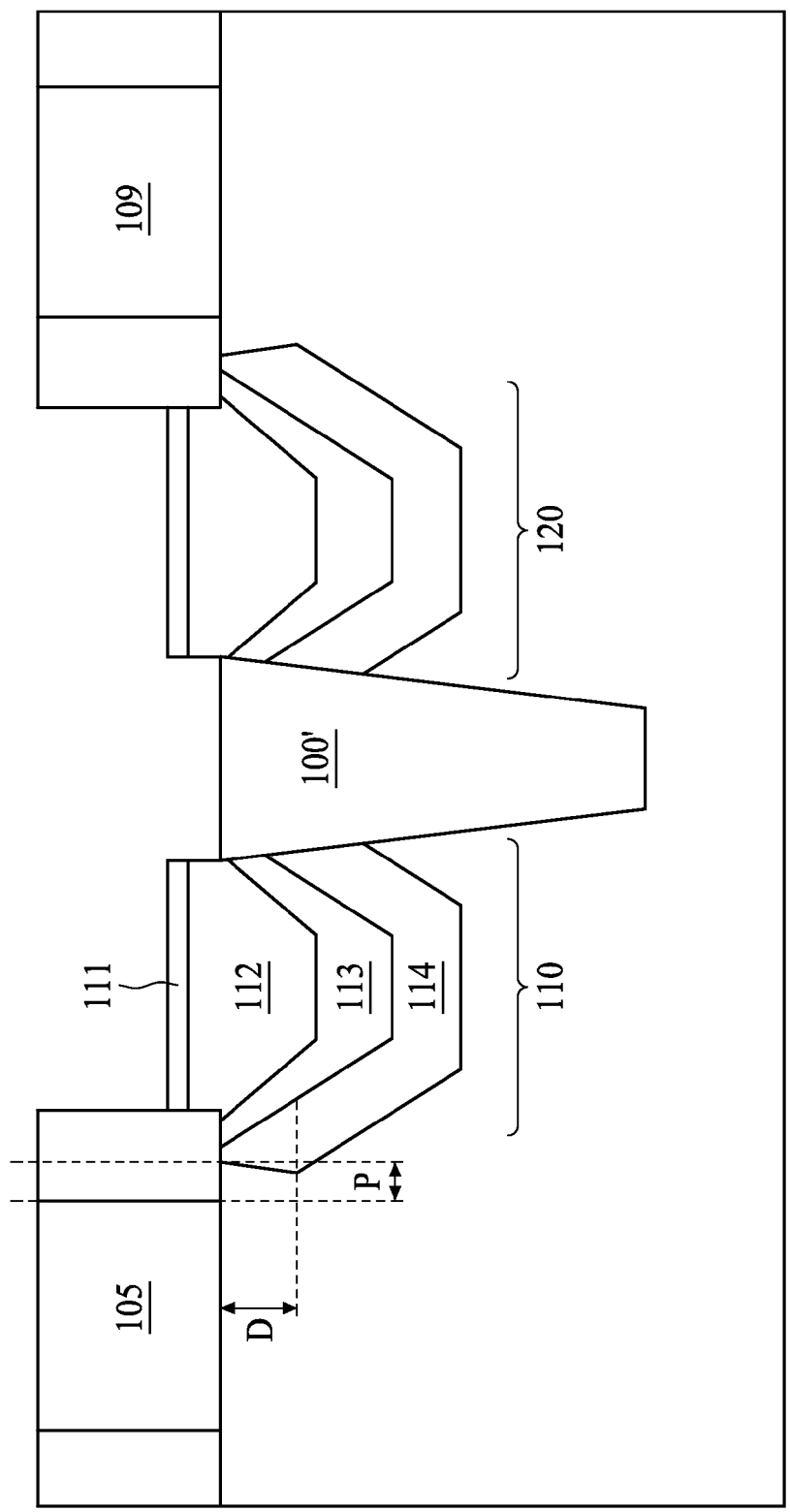
Figure 12B:
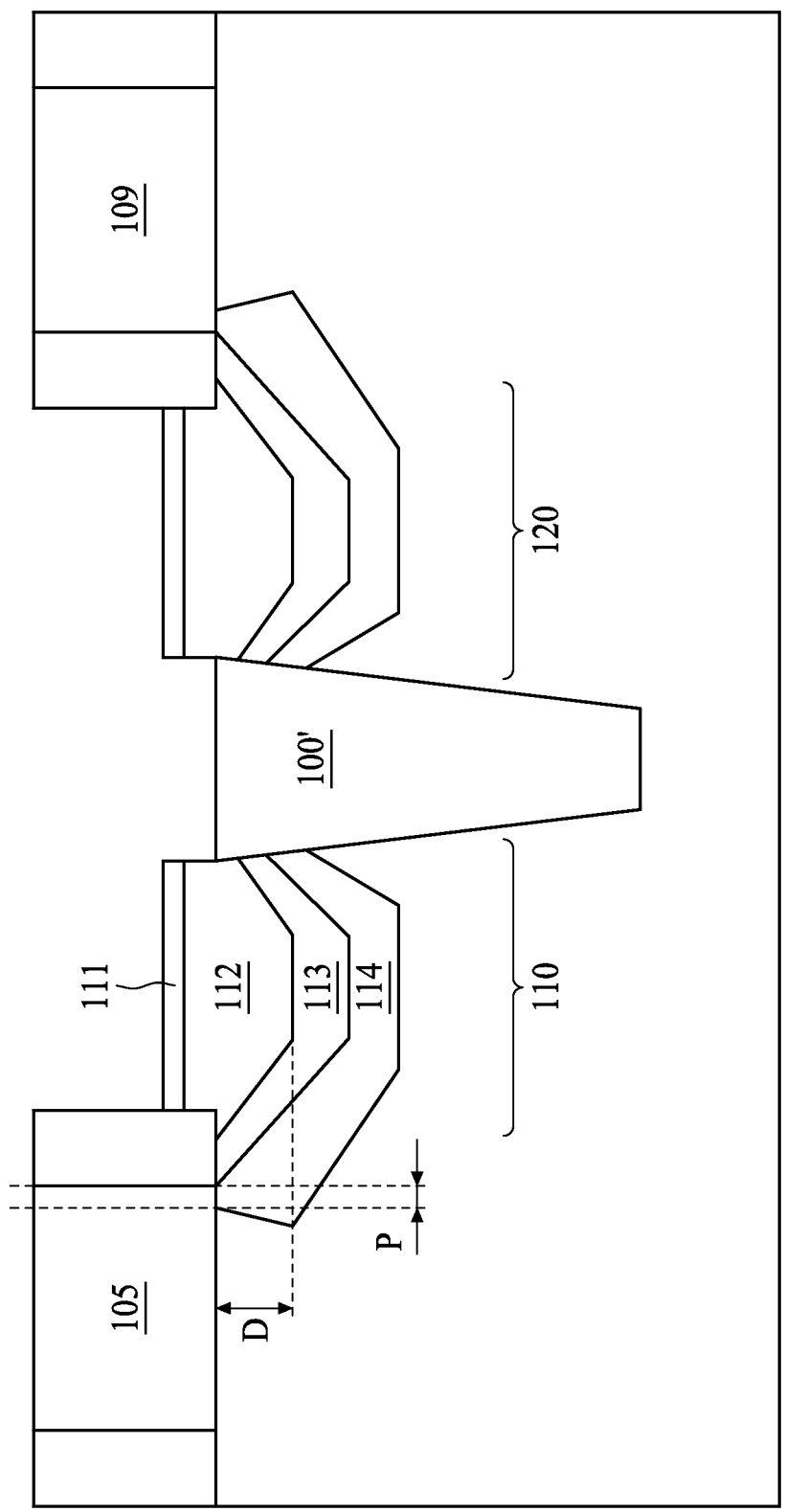

The present disclosure provides a manufacturing method for preparing regrowth region described herein. FIG. 8 to FIG. 12 are cross sectional views of a semiconductor structure in different manufacturing operations. Referring to FIG. 8A to FIG. 9B, an ion implantation operations are performed on a substrate 100 to define two partially overlapped implanted regions. Referring to FIG. 10A to FIG. 11B, a portion of the implanted regions are removed by an isotropic etch, followed by an anisotropic etch, to form a recess in the substrate 100. Referring to FIG. 12A and FIG. 12B, an epitaxial regrown operation is performed to fill the recess previously formed.

Figure 8A:
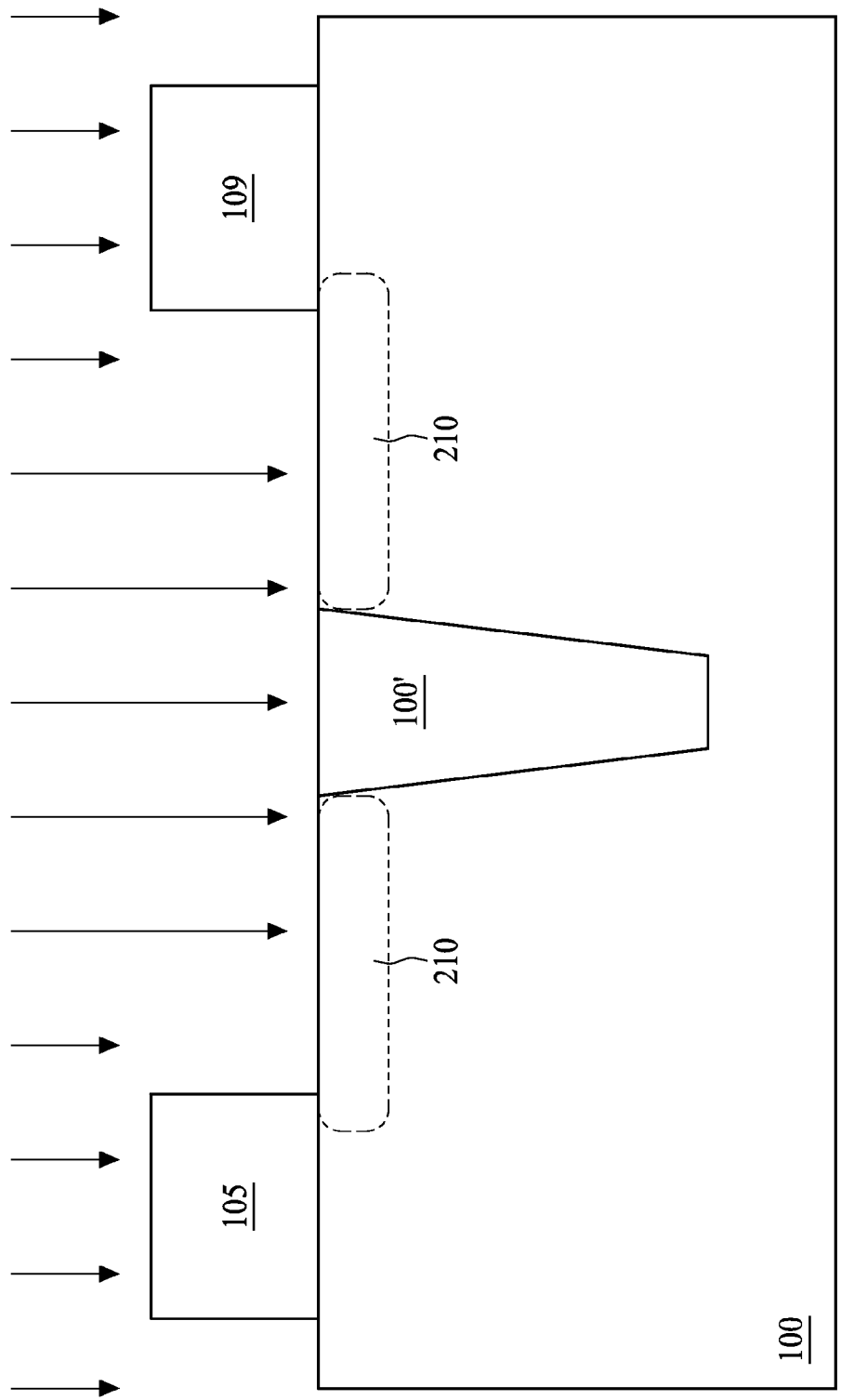
FIG. 8A, FIG. 9A, FIG. 10A, FIG. 11A, FIG. 12A are cross sectional views of a semiconductor structure in different manufacturing operations.
Figure 8B:
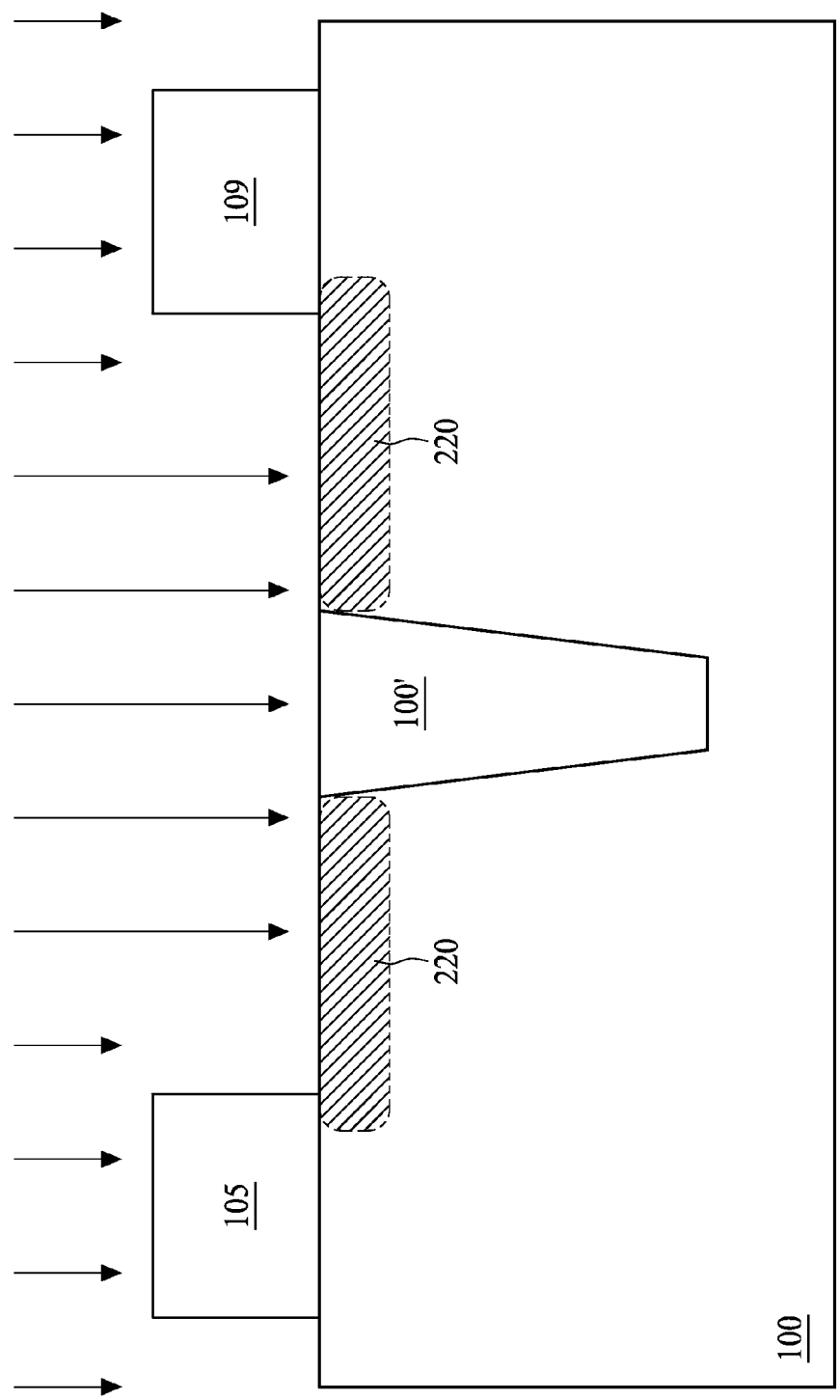
FIG. 8B, FIG. 9B, FIG. 10B, FIG. 11B, FIG. 12B are cross sectional views of a semiconductor structure in different manufacturing operations.
Figure 9A:
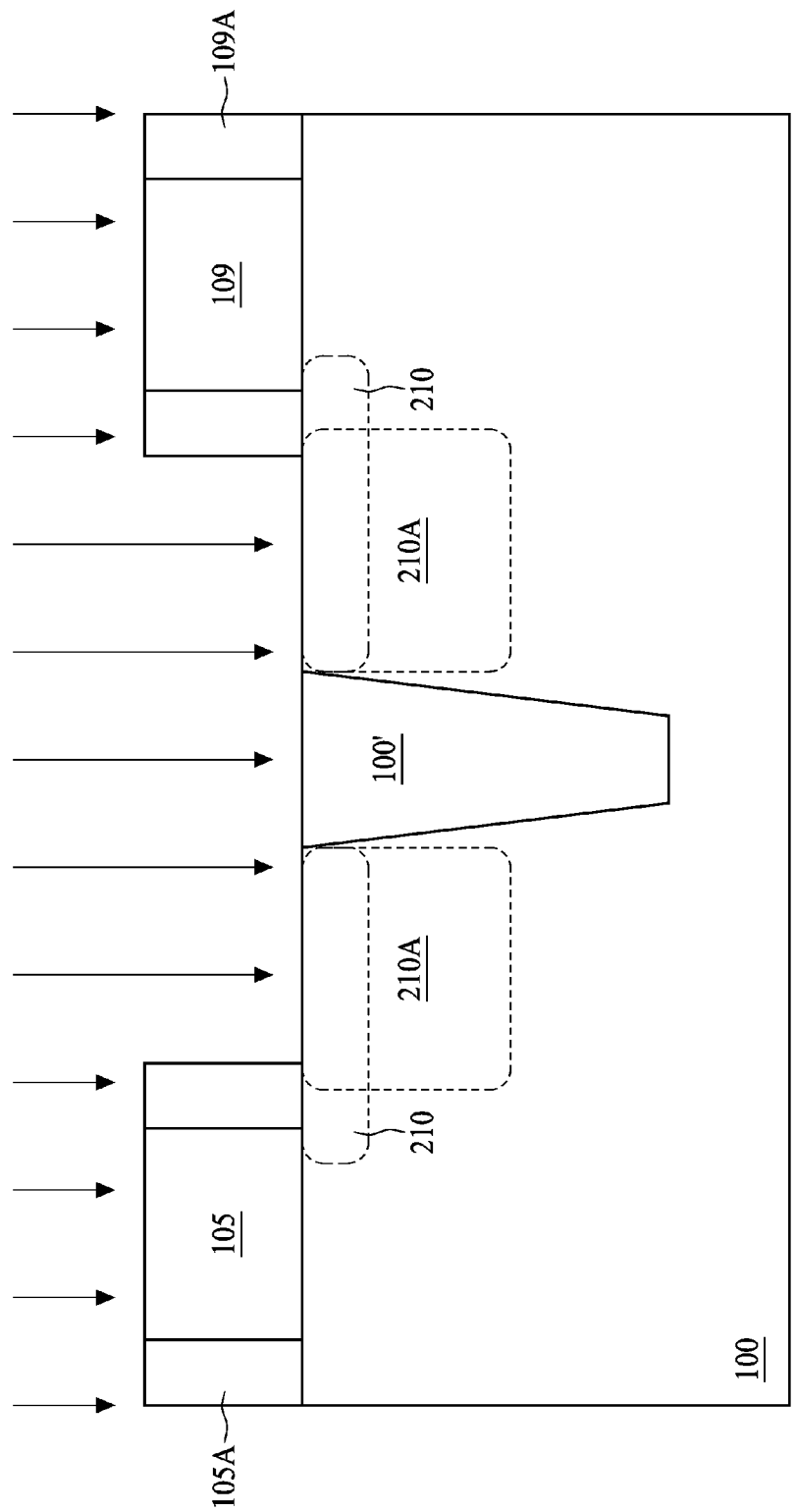
Figure 9B:
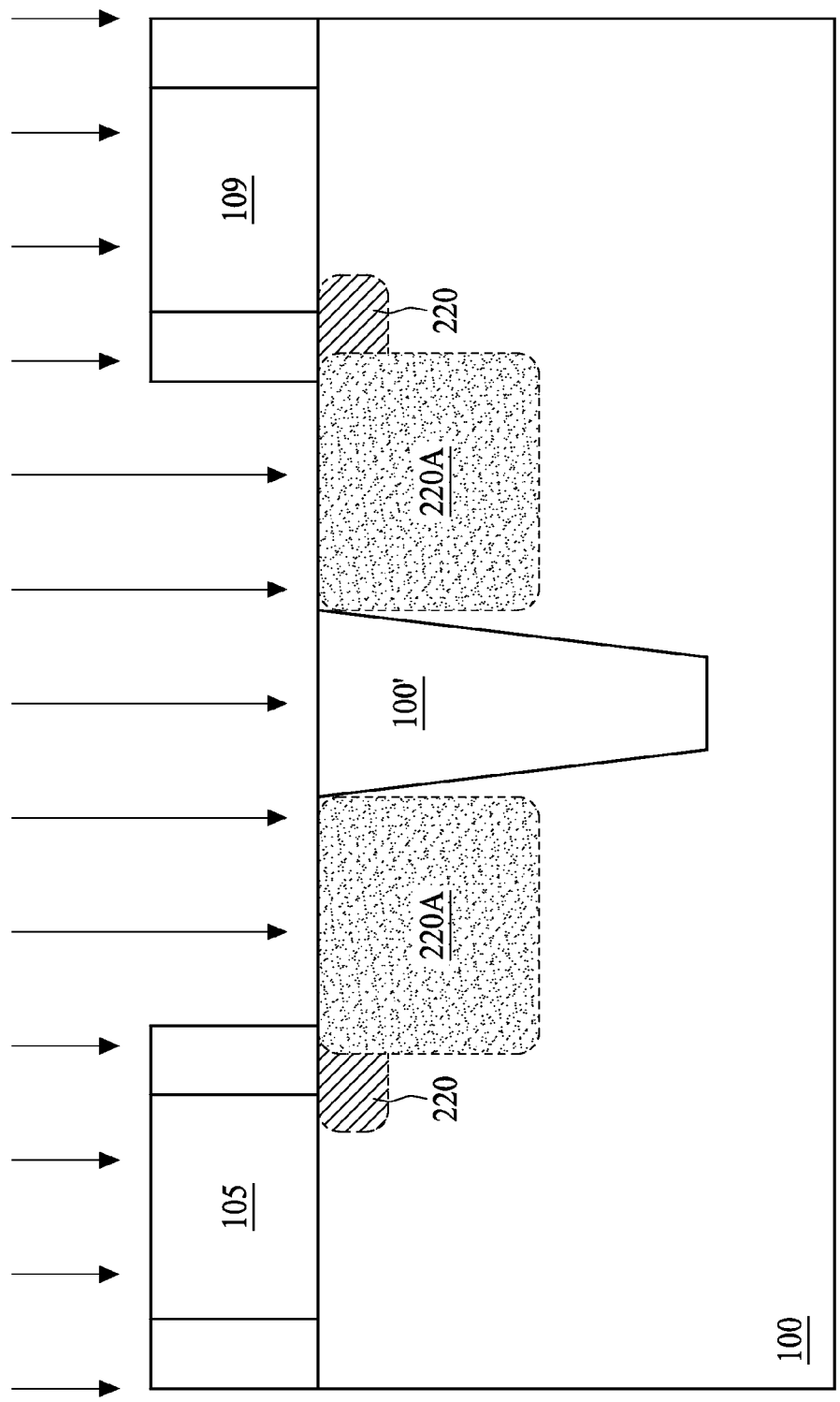

In FIG. 8A and FIG. 8B, a first ion implantation operation is performed to form a shallow doping profiles 210 and 220. The numeral labels in FIG. 8A and FIG. 8B with identical notations as those in previous figures refer to the same or equivalent structures thereof and is not described here for simplicity. A difference between the shallow doping profiles 210 and 220 includes the doping concentration. For example, the doping concentration in the profile 210 is less than that in the profile 220. In some embodiments, the dopant used for the shallow profile includes an etching promoter such as a column III material, a column V material, or a combination thereof. The etching promoter may increase the etching rate of the portion to be removed compared to the case where no etching promoter is implanted. In FIG. 9A and FIG. 9B, a second ion implantation operation is performed to form a deep doping profiles 210A and 220B. The numeral labels in FIG. 9A and FIG. 9B with identical notations as those in previous figures refer to the same or equivalent structures thereof and is not described here for simplicity. Note a sidewall spacer 105A and 109A is formed as a part of the gate and serves as a widened hard mask layer for the second ion implantation operation. A difference between the deep doping profiles 210A and 220A includes the doping concentration. For example, the doping concentration in the profile 210A is less than that in the profile 220A. In some embodiments, the dopant used for the deep profile includes an etching inhibitor such as a column III material, a column V material, or a combination thereof. The etching inhibitor may decrease the etching rate of the portion to be removed compared to the case where no etching inhibitor is implanted.

Figure 10A:
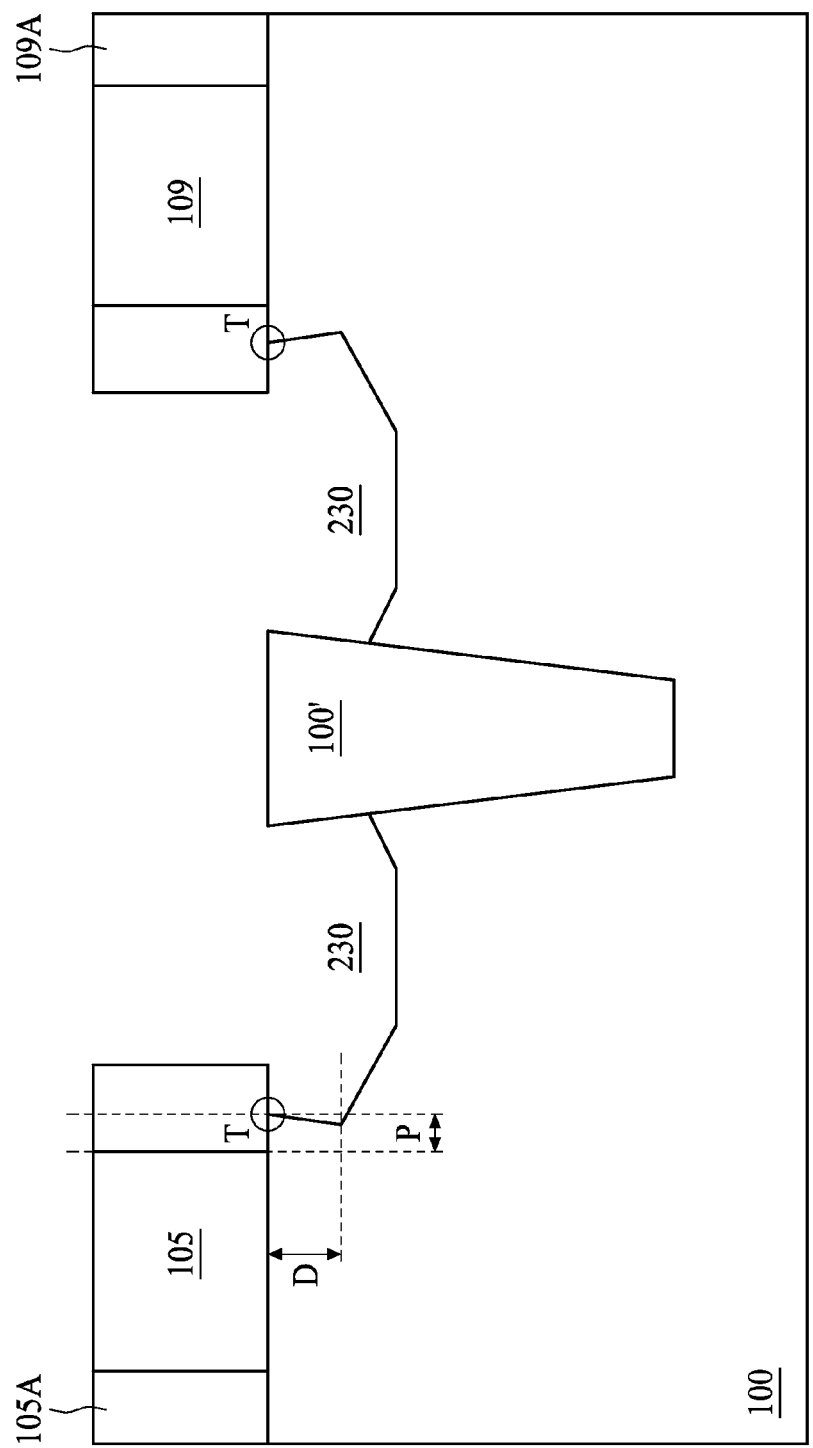
Figure 10B:
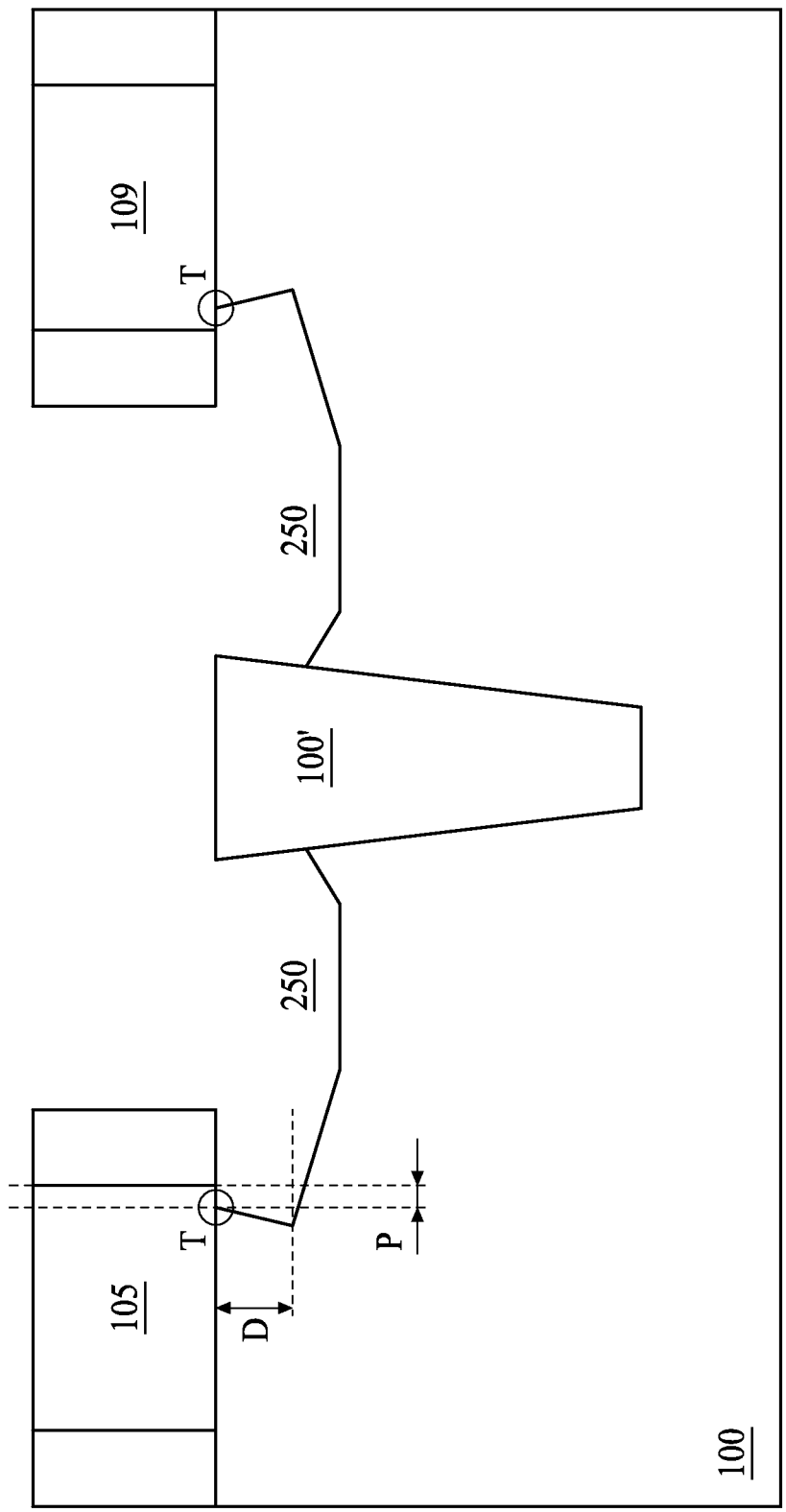

In FIG. 10A and FIG. 10B, a portion of the substrate 100 is removed by an isotropic etch. A shallow recess 230 or 250 is formed as a result of the isotropic etch, and the shallow recess 230 or 250 extends laterally under the gate and the sidewall spacer. In some embodiments, an etchant used for isotropic etch includes hydrofluoric nitric acidic (HNA). As discussed previously in FIG. 9A and FIG. 9B, because the concentration of the etching promoter is greater in the structure shown in FIG. 10B than the structure in FIG. 10A, the lateral encroachment of the shallow recess 230 or 250 is more extended into the gate and the sidewall spacer in the case of FIG. 10B. For example, the proximity P in FIG. 10A is a positive value (i.e. the triple point T is under the sidewall spacer), whereas the proximity P in FIG. 10B is a negative value (i.e. the triple point T is under the gate). In FIG. 11A and FIG. 11B, another portion of the substrate 100 is continuously being removed by an anisotropic etch. A deep recess 230A or 250A is formed as a result of the anisotropic etch. In some embodiments, an etchant used for anisotropic etch includes tetra methyl ammonium hydroxide (TMAH). As discussed previously in FIG. 9A and FIG. 9B, because the concentration of the etching inhibitor is greater in the structure shown in FIG. 11B than the structure in FIG. 11A, the vertical consumption of the substrate material is more pronounced in the case of FIG. 11A. A desired shape of the recess (including the shallow recess and the deep recess) can be tuned by adjusting concentration profile of the etching inhibitor and/or etching promoter under specific etching conditions.

In FIG. 12A and FIG. 12B, a regrowth region is formed in the recess previously created. In some embodiments, for a PMOS transistor, SiGe region 110 and 120, which may also be referred to as a source/drain stressor, is epitaxially grown in recesses 230A and 250A by selective epitaxial growth (SEG). SiGe region 110 and 120 has a lattice constant greater than the lattice constant of substrate 100. In some embodiment, SiGe region 110 and 120 is formed using chemical vapor deposition (CVD). The precursors may include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In some embodiments, the resulting SiGe region 110 and 120 further includes multilayer structures in which different layers possess different germanium concentration profile. For example, the SiGe region 110 and 120 shown in FIG. 12A and FIG. 12B includes a first layer 111 as a top layer, a second layer 112, a third layer 113, and a fourth layer 114 interfaced with the substrate 100. Detailed description regarding the germanium concentration profile and the boron doping concentration in different layers can be referred to previous discussion in the present disclosure.

Some embodiments of the present disclosure provide a semiconductor structure, including a substrate and a regrowth region. The substrate is made of a first material with a first lattice constant, and the regrowth region is made of the first material and a second material, and with a lattice constant different from the first lattice constant. The regrowth region is partially positioned in the substrate. The regrowth region further includes a first layer substantially made of the first material, and the first layer having substantially the first lattice constant.

In some embodiments of the present disclosure, the first layer is situated as a top of the regrowth region, and the first layer includes a thickness of from about 3 nm to about 15 nm.

In some embodiments of the present disclosure, the regrowth region further includes a second layer with a second lattice constant, and the bottom of the second layer is above a surface of the substrate.

In some embodiments of the present disclosure, the regrowth region is a source or a drain of a P-Field Effect Transistor, and the first material is Si, the second material is Ge. The second layer has a Ge atomic percentage of from about 20% to about 60%.

In some embodiments of the present disclosure, the regrowth region further includes a third layer under the second layer. The third layer includes a Ge atomic percentage of from about 20% to about 60%.

In some embodiments of the present disclosure, the regrowth region is a source or a drain of a P-Field Effect Transistor. The first layer includes Boron-doped silicon.

In some embodiments of the present disclosure, the regrowth region includes a "tip depth" measured vertically from the surface of the substrate to a widest vertex of the regrowth region, and the tip depth being less than about 10 nm.

In some embodiments of the present disclosure, the regrowth region further includes a fourth layer interfaced with the substrate. The fourth layer has a sidewall thickness measured in a transverse direction a predetermined value below the surface, from an interface between the substrate and the fourth layer to a layer further from the substrate. The sidewall thickness possesses a linear relation with the tip depth among a plurality of the regrowth regions. The tip depth is measured vertically from the surface of the substrate to a widest vertex of the regrowth region.

In some embodiments of the present disclosure, the regrowth region further includes a "proximity" measured in a transverse direction along the surface of the substrate, starting from an interface between a gate and a sidewall spacer of the gate to a point where the fourth layer intercepting with the surface, and the proximity being less than about 2 nm.

Some embodiments of the present disclosure provide a semiconductor structure, including a substrate and a regrowth region. The substrate is made of a first material with a first lattice constant, and the regrowth region is made of the first material and a second material, having a lattice constant different from the first lattice constant. The regrowth region is partially positioned in the substrate. The regrowth region has a "tip depth" measured vertically from a surface of the substrate to a widest vertex of the regrowth region, and the tip depth being less than 10 nm.

In some embodiments of the present disclosure, the regrowth region further includes a "proximity" measured in a transverse direction along the surface of the substrate, from an interface between a gate and a sidewall spacer of the gate to a point where a layer at a bottom of the regrowth region intercepting with the surface, and the proximity being less than about 2 nm.

In some embodiments of the present disclosure, the tip depths among a plurality of the regrowth regions are within a quantity variation of about 2 nm.

In some embodiments of the present disclosure, the regrowth region further includes a first grading region and a second grading region. The first grading region includes a sidewall thickness measured in a transverse direction a predetermined value below the surface, from an interface between the substrate and a layer at a bottom of the regrowth region to a layer further from the substrate. The sidewall thickness has a linear relation with the tip depth among a plurality of the regrowth regions.

In some embodiments of the present disclosure, the layer at the bottom of the regrowth region intercepts with the surface under the gate, and the proximity is less than about 1 nm.

In some embodiments of the present disclosure, the regrowth region further includes a first grading region and a second grading region. The first grading region includes a sidewall thickness measured in a transverse direction a predetermined value below the surface, from an interface between the substrate and the layer at the bottom of the regrowth region to a layer further from the substrate. The sidewall thickness is in a range of from about 5 nm to about 15 nm.

In some embodiments of the present disclosure, the regrowth region further includes a top layer substantially made of the first material, and the top layer having substantially the first lattice constant.

Some embodiments of the present disclosure provide a method for manufacturing a semiconductor structure. The method includes performing ion implantation operations on a substrate to define two partially overlapped implanted regions in a portion of the substrate to be removed; removing at least a portion of the implanted regions by an isotropic etch followed by an anisotropic etch to form a recess in the substrate; and regrowing semiconductor materials in the recess.

In some embodiments of the present disclosure, the performing ion implantation operations on the substrate to define two partially overlapped implanted regions includes performing an etch-promoting ion implantation prior to a formation of a sidewall spacer of a gate, and performing an etch-inhibiting ion implantation after the formation of the sidewall spacer of the gate.

In some embodiments of the present disclosure, the removing at least a portion of the implanted regions by an isotropic etch followed by an anisotropic etch includes utilizing hydrofluoric nitric acidic for the isotropic etch and utilizing tetra methyl ammonium hydroxide for the anisotropic etch.

In some embodiments of the present disclosure, the performing ion implantation operations on the substrate to define two partially overlapped implanted regions comprise implanting III-V materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate made of a first material, having a first lattice constant; and
a plurality of regrowth regions made of the first material and a second material, having a lattice constant different from the first lattice constant and partially positioning in the substrate, each of the plurality of regrowth regions comprising a first grading region interfacing with the substrate and a second grading region over the first grading region;
a gate surrounded by a sidewall spacer, the first grading region being in contact with a bottom of the sidewall spacer;
wherein each of the plurality of regrowth regions comprises a tip depth measured vertically from a surface of the substrate to a widest vertex of the regrowth region, the tip depth being less than 10 nm, the second grading region extending under a bottom of the sidewall spacer and being in contact with the bottom of the sidewall spacer.

2. The semiconductor structure of claim 1, each of the plurality of the regrowth regions further comprising a proximity measured in a transverse direction along the surface of the substrate, from an interface between the gate and the sidewall spacer to a point where the first grading region intercepting with the surface, and the proximity being less than about 2 nm.

3. The semiconductor structure of claim 1, tip depths among the plurality of the regrowth regions are within a quantity variation of about 2 nm.

4. The semiconductor structure of claim 1, wherein the first grading region comprises a sidewall thickness measured in a transverse direction a predetermined value below the surface, from an interface between the substrate and the first grading region to the second grading region, sidewall thicknesses of the plurality of regrowth regions plotted against tip depths of the plurality of regrowth regions following a regression curve.

5. The semiconductor structure of claim 2, wherein the first grading region intercepts with the surface under the sidewall spacer, and the proximity is less than about 1 nm.

6. The semiconductor structure of claim 1, wherein the first grading region comprises a sidewall thickness measured in a transverse direction a predetermined value below the surface, from an interface between the substrate and the first grading region to the second grading region, the sidewall thickness being in a range of from about 5 nm to about 15 nm.

7. The semiconductor structure of claim 1, wherein the regrowth region further comprises a top layer substantially made of the first material, and the top layer having substantially the first lattice constant.

8. A semiconductor structure, comprising:
a substrate made of a first material, having a first lattice constant;
a sidewall spacer at a top surface of the substrate; and
a plurality of regrowth regions made of the first material and a second material, the second material having a lattice constant different from the first lattice constant and partially positioning in the substrate, each of the plurality of regrowth regions comprising a first grading region interfacing with the substrate and a second grading region over the first grading region, the second grading region extending beneath and in contact with a bottom of the sidewall spacer, and each of the plurality of regrowth regions comprising a tip depth measured vertically from a surface of the substrate to a widest vertex of each of the plurality of regrowth regions;
wherein the first grading region comprises a sidewall thickness measured in a transverse direction 0.01 micrometer below the surface, sidewall thicknesses of the plurality of regrowth regions plotted against tip depths of the plurality of regrowth regions following a regression curve.

9. The semiconductor structure of claim 8, wherein the sidewall thickness of each of the plurality of regrowth regions is in a range of from about 5 nm to about 15 nm.

10. The semiconductor structure of claim 8, wherein the tip depth of each of the plurality of regrowth regions is less than about 10 nm.

11. The semiconductor structure of claim 8, wherein a top surface of the second grading region protrudes from the top surface of the substrate.

12. The semiconductor structure of claim 11, wherein the sidewall spacer laterally surrounding a gate on the top surface of the substrate.

13. The semiconductor structure of claim 8, wherein each of the plurality of regrowth regions further comprises a top layer over the second grading layer, the top layer being substantially made of the first material, and the top layer having substantially the first lattice constant.

14. The semiconductor structure of claim 8, wherein the tip depths between two adjacent regrowth regions are within a quantity variation of about 2 nm.

15. The semiconductor structure of claim 8, wherein the regression curve comprises:

$$\text{Sidewall Thickness} = \text{Tip Depth} * 0.6743 + 4.2556,$$

16. A transistor structure, comprising:
a silicon substrate;
a gate structure over a top surface of the substrate;

a first regrowth region abutting the gate structure and partially disposed in the substrate, the first regrowth region comprising silicon and germanium, and the first regrowth region being in contact with a bottom of the gate structure, the first regrowth region comprising a first grading region in contact with the silicon substrate and a second grading region over the first grading region, the second grading region extending underneath and being in contact with a bottom of the gate structure;

a silicon top layer over the first regrowth region, wherein the first regrowth region comprises a tip depth measured vertically from the top surface of the silicon substrate to a widest vertex of the first regrowth region under the gate structure, the tip depth being less than about 10 nm.

17. The transistor structure of claim 16, wherein the first grading region comprising a sidewall thickness measured in a transverse direction 0.01 micrometer below the top surface of the substrate, the sidewall thickness being in a range of from about 5 nm to about 15 nm.

18. The transistor structure of claim 17, wherein the second grading region comprising a top surface over the top surface of the silicon substrate.

19. The transistor structure of claim 16, further comprising a second regrowth region abutting the gate structure, a tip depth of the second regrowth region and the tip depth of the first regrowth region are within a quantity variation of about 2 nm.

20. The transistor structure of claim 16, wherein the first regrowth region further comprising a proximity measured in a transverse direction along the top surface of the substrate, from an interface between a gate and a sidewall spacer of the gate structure to a point where the first grading region intercepting with the top surface of the substrate, and the proximity being less than about 2 nm.

* * * * *